(12) United States Patent  
Nakayama et al.

(10) Patent No.: US 10,818,813 B2
(45) Date of Patent: Oct. 27, 2020

(54) SEMICONDUCTOR DEVICE AND MANUFACTURING METHOD THEREOF

(71) Applicant: RENESAS ELECTRONICS CORPORATION, Tokyo (JP)

(72) Inventors: Tomoo Nakayama, Ibaraki (JP); Shinichi Watanuki, Ibaraki (JP); Futoshi Komatsu, Ibaraki (JP); Teruhiro Kuwajima, Ibaraki (JP); Takashi Ogura, Ibaraki (JP); Hiroyuki Okuaki, Ibaraki (JP); Shigeaki Shimizu, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 53 days.

(21) Appl. No.: 16/188,985

(22) Filed: Nov. 13, 2018

(65) Prior Publication Data

US 2019/0198703 A1     Jun. 27, 2019

(30) Foreign Application Priority Data

Dec. 27, 2017     (JP) .................. 2017-250883

(51) Int. Cl.
*H01L 31/105*     (2006.01)
*H01L 31/18*     (2006.01)
(Continued)

(52) U.S. Cl.
CPC ........ *H01L 31/1055* (2013.01); *G02B 6/1225* (2013.01); *G02B 6/136* (2013.01);
(Continued)

(58) Field of Classification Search
None
See application file for complete search history.

(56) References Cited

U.S. PATENT DOCUMENTS 6,633,071 B1 * 10/2003 Furio ................. H01L 29/456
                                                                257/383
9,425,240 B2 * 8/2016 Liang ................. H01L 51/107
(Continued)

FOREIGN PATENT DOCUMENTS

JP      2013-207231 A     10/2013
JP      2014-183195 A      9/2014
JP      2017-049504 A      3/2017

*Primary Examiner* — Hrayr A Sayadian
(74) *Attorney, Agent, or Firm* — McDermott Will & Emery LLP

(57) ABSTRACT

In order to improve the performance of a semiconductor device, a semiconductor layer EP is formed over a p-type semiconductor PR. An n-type semiconductor layer NR1 is formed over the semiconductor layer EP. The semiconductor layer PR, the semiconductor layer EP, and the semiconductor layer NR1 respectively configure part of a photoreceiver. A cap layer of a material different from that of the semiconductor layer EP is formed over the semiconductor layer EP, and a silicide layer, which is a reaction product of a metal and the material included in the cap layer, is formed within the cap layer. A plug having a barrier metal film BM1 is formed over the cap layer through the silicide layer. Here, a reaction product of the metal and the material included in the semiconductor layer NR1 is not formed within the semiconductor layer NR1.

9 Claims, 11 Drawing Sheets

(51) Int. Cl.
*G02B 6/136* (2006.01)
*G02B 6/122* (2006.01)
*H01L 31/0224* (2006.01)
*G02B 6/12* (2006.01)

(52) U.S. Cl.
CPC .... *H01L 31/022408* (2013.01); *H01L 31/105* (2013.01); *H01L 31/1804* (2013.01); *G02B 2006/1213* (2013.01); *G02B 2006/12061* (2013.01)

(56) References Cited

U.S. PATENT DOCUMENTS

| | | | | |
|---|---|---|---|---|
| 2002/0047175 | A1* | 4/2002 | Tani | H01L 27/14609 |
| | | | | 257/432 |
| 2004/0021060 | A1* | 2/2004 | Ohkawa | H01L 27/14689 |
| | | | | 250/214.1 |
| 2017/0069769 | A1 | 3/2017 | Usami et al. | |

* cited by examiner

SEMICONDUCTOR DEVICE AND MANUFACTURING METHOD THEREOF

CROSS-REFERENCE TO RELATED APPLICATIONS

The disclosure of Japanese Patent Application No. 2017-250883 filed on Dec. 27, 2017 including the specification, drawings and abstract is incorporated herein by reference in its entirety.

BACKGROUND

The present invention relates to a semiconductor device and a manufacturing method thereof, for example, which can be suitably used for a semiconductor device having an optical device and its manufacturing method.

Recently silicon photonics technology has been developed. The silicon photonics technology is the technology that achieves a semiconductor device as an optical communication module by forming a transmission line for optical signals by the use of silicon or germanium as a material over a semiconductor substrate, and by integrating various optical devices and electronic devices formed by the optical signal transmission line. Some of such semiconductor devices have an optical waveguide, as a transmission line for optical signals, which is comprised of a semiconductor layer formed over a semiconductor substrate through an insulating layer, as well as an insulating film formed so as to cover the optical waveguide over the insulating layer. At this time, the optical waveguide functions as a core layer, and the insulating layer and the insulating film function as a clad layer.

Further, some of such semiconductor devices have a photoelectric conversion unit capable of converting optical signal to electric signal. Further, some semiconductor devices also have a photoreceiver including a semiconductor layer of germanium, as a photoelectric conversion unit, in order to detect near infrared light with wavelengths up to about 1.6 μm which is the communication wavelength band.

Japanese Unexamined Patent Application Publication No. 2013-207231 discloses a technique for reducing leakage current by forming a Si layer as a protective film over a germanium layer. Further, Patent Document 1 discloses a plug of a metal formed over the Si layer. Then, there is disclosed a technique for preventing an increase of resistance due to addition of the Si layer in an area in which the Si layer and the plug come into contact with each other by forming the entire Si layer below the plug as NiSi layer and part of the germanium layer as NiGe layer.

Japanese Unexamined Patent Application Publication No. 2014-183195 discloses a technique for forming a SiGe layer as a protective film over a germanium layer in a germanium photoreceiver, and forming a plug of a metal over the SiGe layer through a TiN film.

Japanese Unexamined Patent Application Publication No. 2017-49504 discloses a silicon photonics technology having an optical waveguide and a photoelectric conversion unit.

SUMMARY

In a photoreceiver including a germanium layer, it is desirable to reduce dark current in the germanium layer. Further, when a plug of metal is coupled over the germanium layer though a protective film such as silicon, it is desirable to reduce resistance between the germanium layer and the plug as much as possible.

The above and other objects and novel features of the present invention will be apparent from the description of the present specification and the accompanying drawings.

Of the embodiments disclosed in this application, a brief description of a typical embodiment is as follows.

A semiconductor device according to an embodiment includes: a first semiconductor layer that is formed over a substrate and includes an impurity of a first conductive type; a second semiconductor layer formed over the first semiconductor layer; and a third semiconductor layer formed within the second semiconductor layer, the third semiconductor layer being part of the second semiconductor layer and including an impurity of a second conductive type opposite to the first conductive type. Further, the semiconductor device includes: a fourth semiconductor layer formed over the third semiconductor layer, the fourth semiconductor layer being comprised of a material different from that of the material of the second semiconductor layer; a first compound layer formed within the fourth semiconductor layer, the first compound layer being a reaction product of a first metal and the material included in the fourth semiconductor layer; and a first plug formed over the first compound layer, the first plug being electrically coupled to the third semiconductor layer through the first compound layer. Here, the first semiconductor layer, the second semiconductor layer, and the third semiconductor layer respectively configure part of a photoreceiver. The reaction product of the first metal and the material included in the third semiconductor layer is not formed within the third semiconductor layer.

According to an embodiment, it is possible to improve the performance of the semiconductor device.

DETAILED DESCRIPTION

Figure 1:
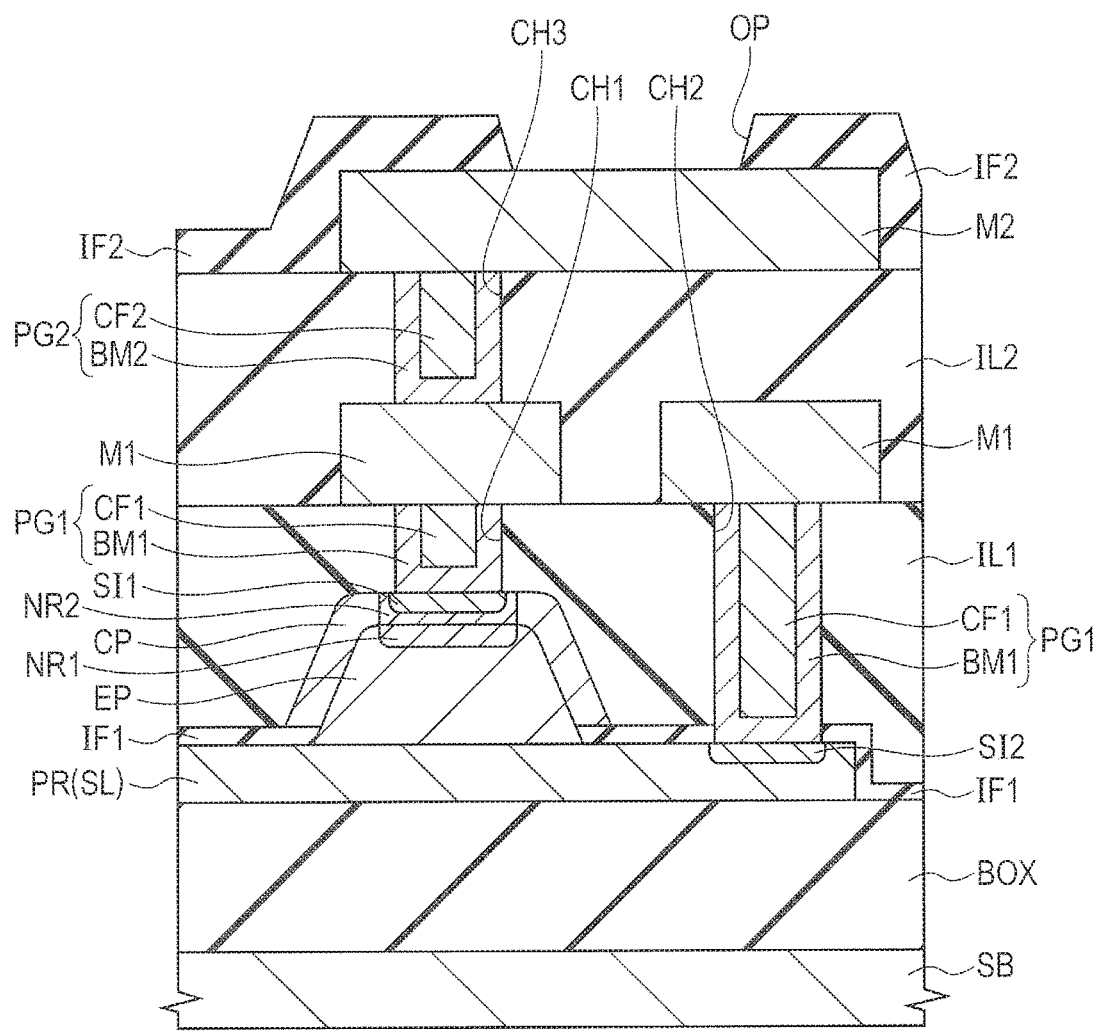
FIG. 1 is a fragmentary cross-sectional view of a semiconductor device according to a first embodiment.

In the following embodiments, the invention is described by dividing it into a plurality of sections or embodiments when required as a matter of convenience. However, these sections or embodiments are not irrelevant to each other unless expressly stated otherwise, and one serves as a variation, a detailed description, a supplementary explanation, and the like of part or the whole of the other. Further, in the following embodiments, when referring to the number of elements (including the number of pieces, numerical value, amount, range, and the like), the number of elements is not limited to a specific number unless expressly stated otherwise and except for cases such as when the number is clearly limited in principle to a specific number. The number of elements can be greater or smaller than the specific number. Further in the following embodiments, it goes without saying that the components (also including elements steps and the like) are not necessarily required, unless expressly stated otherwise and except for cases such as when they are considered to be clearly required in principle. Also, in the following embodiment, when referring to the shape, the positional relationship, or other characteristics of the components and the like, those substantially approximate or similar to the shape or other characteristics are included unless expressly stated otherwise and unless they are clearly considered not to be so in principle. This also applies to the numerical value and the range.

Hereinafter, preferred embodiments will be described in detail based on drawings. Note that elements having the same functions are denoted by the same reference numerals in all the drawings for describing the embodiments, and the repetitive description thereof will be omitted. Further in the following embodiments, the description of the same or similar parts will not be repeated in principle unless otherwise necessary.

Further, in the figures used in the following embodiments, hatching may be omitted to make the figures easy to understand.

Further, in the embodiments, p-type semiconductor means semiconductor into which an impurity such as boron (B) or boron difluoride ($BF_2$) is introduced and n-type semiconductor means semiconductor into which an impurity such as arsenic (As) or phosphorus (P) is introduced. Further, in the embodiments, i-type semiconductor means intrinsic semiconductor, or p or n type semiconductor having an impurity concentration of less than $1\times10^{17}/cm^3$.

First Embodiment

Hereinafter, the structure of a semiconductor device of the present embodiment, the manufacturing method of a semiconductor device of the present embodiment, semiconductor devices of study examples, and main features of the present embodiment are described sequentially.

<Structure of Semiconductor Device>

A semiconductor device according to the present embodiment is related to silicon phonics technology, including, for example, an optical waveguide which is a transmission line for optical signals, a light modulation unit that converts electrical signal to optical signal, and a photoelectric conversion unit that converts optical signal to electrical signal. Here, the characteristic feature of the semiconductor device according to the present embodiment resides in the photoelectric conversion unit. Thus, a detailed description of other structures such as the optical waveguide and the light conversion unit will be omitted. For example, the known configuration used in the silicon photonics technology can be applied to the optical waveguide and the light conversion unit.

FIG. 1 shows a cross-sectional structure of a semiconductor device with a photoreceiver of a photoelectric conversion unit. This photoreceiver is a pin junction structure including a p-type semiconductor layer PR, an i-type semiconductor layer EP, and a semiconductor layer NR1 which is a region in which an n-type impurity is introduced into part of the semiconductor layer EP. The structure of the photoreceiver of the pin junction structure as well as the surrounding structure will be described below in detail.

As shown in FIG. 1, the semiconductor device according to the present embodiment uses an SOI (Silicon on Insulator) substrate including: a semiconductor substrate SB; an insulating layer BOX formed over the semiconductor substrate SB; and a semiconductor layer SL formed over the semiconductor substrate SB through the insulating layer BOX. The semiconductor substrate SB is comprised, for example, of a p-type silicon (Si) single crystal substrate having a plane orientation (100) with resistivity of about 5 to 50 Ωcm. The insulating layer BOX is, for example, a silicon oxide ($SiO_2$) film. The semiconductor layer SL is obtained, for example, by thinning the p-type silicon single crystal substrate having the plane orientation (100) with resistivity of about 5 to 50 Ωcm. The film thickness of the insulating layer BOX is, for example, about 2 to 3 μm, and the film thickness of the semiconductor layer SL is, for example, about 180 to 250 nm. However, the substrate is not limited to those having the semiconductor substrate SB for support, and can be a substrate of two-layer structure in which a semiconductor layer is provided over an insulating layer (sapphire) that functions as a supporting substrate, such as SOS (Silicon on Sapphire) substrate.

The semiconductor layer SL is selectively patterned and a plurality of semiconductor layers SL are present over the insulating layer BOX. In FIG. 1, only one semiconductor layer SL is shown. The semiconductor layer SL of the photoelectric conversion unit configures part of the pin junction structure. The semiconductor layer SL is a semiconductor layer PR into which a p-type impurity is introduced, and has an impurity concentration of, for example, about $1\times10^{19}$ to $1\times10^{20}/cm^3$. Note that the semiconductor layer SL is formed, for example, as a waveguide in areas other than the photoelectric conversion unit.

An insulating film IL1 is formed over the upper and side surfaces of the semiconductor layer PR. The insulating film IF1 is a film that covers the area in which the semiconductor layer NR1 should not be formed over the insulating layer BOX from the point of view of forming the semiconductor layer NR1, described below, only in a predetermined position by epitaxial growth. The material and film thickness of the insulating film IF1 is not particularly limited as long as it achieves the above goal. The insulating film IF1 is comprised, for example, of silicon oxide or silicon nitride.

The film thickness of the insulating film FI1 is, for example, about 20 to 40 nm. Further, part of the insulating film IF1 is removed and a through part is formed in the insulating film IF1. The upper surface of the semiconductor layer PR is exposed within the through part.

The i-type semiconductor layer EP is formed over the upper surface of the semiconductor layer PR not covered by the insulating film IF1. For example, the semiconductor layer EP is comprised of germanium. The film thickness of the semiconductor layer EP is 300 nm to 1 μm. The semiconductor layer NR1 into which an n-type impurity is introduced, which is part of the semiconductor layer EP, is formed over the surface of the semiconductor layer EP. The impurity concentration of the n-type semiconductor layer NR1 is, for example, $1 \times 10^{19}$ to $1 \times 10^{20}/cm^3$. The semiconductor layer NR1 is formed in the region extending from the upper surface of the semiconductor layer EP to a depth of about 20 nm.

Here, germanium is characterized in that the forbidden bandwidth is narrower than silicon. Thus, by using the pin conjunction structure configured with the semiconductor layer PR of silicon, the semiconductor layer EP of germanium, and the semiconductor layer NR1, it is possible to detect infrared light with wavelengths up to about 1.6 μm corresponding to the communication wavelength band.

A cap layer (semiconductor layer) CP is formed over the semiconductor layer NR1. The cap layer CP is formed of a material different from that of the semiconductor layer NR1. For example, the cap layer CP is comprised of silicon (Si) or silicon germanium (SiGe). The film thickness of the cap layer CP is, for example, about 20 to 50 nm. In the present embodiment, the cap layer CP is an epitaxial growth film. An n-type impurity is introduced into part of the cap layer to form an n-type semiconductor layer NR2. The impurity concentration of the n-type semiconductor layer NR2 is, for example, $1 \times 10^{19}$ to $1 \times 10^{20}/cm^3$. The semiconductor layer NR2 is formed in a position contacting the semiconductor layer NR1.

The cap layer CP is provided to mainly prevent a problem that the surface of the semiconductor layer EP is damaged, or prevent a problem that the film thickness of the semiconductor layer EP is reduced. The photoreceiver of pin junction structure is formed below the cap layer CP. However, the cap layer CP itself is not a necessary configuration for the photoreceiver. Further, when the film thickness of the cap layer CP increases, the cap layer CP itself becomes highly resistive and the current flowing through the photoreceiver reduces. For this reason, it is desirable that the film thickness of the cap layer CP is made small as much as possible, and preferably, smaller than the film thickness of the semiconductor layer EP.

An interlayer insulting film IL1 is formed over the insulting film IF1 and over the cap layer CP. The interlayer insulating film IL1 is comprised, for example, of silicon oxide. Further, a flattening process is applied to the upper surface of the interlayer insulating film IL1.

A contact hole CH1 reaching the cap layer CP (semiconductor layer NR2) as well as a contact hole CH2 reaching the semiconductor layer PR are formed in the interlayer insulating film IL1. A conductive film CF1 is formed inside the contact hole CH1 and the contact hole CH2, respectively, through a barrier metal film BM1. The barrier metal film BM1 is comprised of a laminated film of a metal film such as titanium (Ti) and a metal nitride film such as titanium nitride (TiN). Here, the film thickness of the metal film is, for example, about 10 to 20 nm, and the film thickness of the titanium nitride film is, for example, about 10 to 20 nm. The conductive film CF1 is comprised, for example, of tungsten. The barrier metal film BM1 and the conductive film CF1, which are formed inside the contact hole CH1 and the contact hole CH2, respectively, configure a plug PG1. By providing the plug PG1 inside the contact hole CH1, the direct current that flows by the photovoltaic effect in the pin junction structure can be taken to the outside.

A silicide layer (compound layer) SI1 is formed within the semiconductor layer NR2 located below the plug PG1. When the semiconductor material included in the semiconductor layer NR2 is silicon and when the metal material included in the barrier metal film BM1 is titanium, the silicide layer SI1 is a layer formed by reaction between silicon included in the semiconductor layer NR2 and titanium included in the barrier metal film BM1. For example, the silicide layer SI1 is comprised of titanium silicide ($TiSi_2$). Further, a silicide layer SI2 is formed within the semiconductor layer PR located below the plug PG1. The silicide layer SI2 is a layer formed by reaction between silicon included in the semiconductor layer PR and titanium included in the barrier metal film BM1. For example, the silicide layer SI2 is comprised of titanium silicide ($TiSi_2$).

In this way, the plug PG1 formed inside the contact hole CH1 is electrically coupled to the semiconductor layer R1 through the silicide layer SI1 and the semiconductor layer NR2. Then, the plug PG1 formed inside the contact hole CH2 is electrically coupled to the semiconductor layer PR through the silicide layer SI2.

Here, the thickness of the silicide layer SI2 is about 10 to 30 nm. Further, the thickness of the silicide layer SI1 is equal to the thickness of the silicide layer SI2, for example, about 10 to 30 nm. The thickness of the silicide layer SI1 is thinner than the film thickness of the cap layer CP. More specifically, the bottom surface of the silicide layer SI1 is located within the semiconductor layer NR2 and does not reach the semiconductor layer NR1. In other words, the bottom surface of the silicide layer SI1 is located on the side of the semiconductor layer NR2 from the interface between the semiconductor layer NR2 and the semiconductor layer NR1.

Although described in detail later, a germanide layer, which is a compound layer of the semiconductor material included in the semiconductor layer NR1 and the metal material included in the barrier metal film BM1, such as TiGe layer, is not formed within the semiconductor layer NR1. Thus, the semiconductor device according to the present embodiment can prevent defects such as an increase in dark current caused by the germanide layer.

A line M1 coupled to the plug PG1 is formed over the interlayer insulating film IL1. The line M1 is comprised of an aluminum-based conductive film as well as barrier metal films respectively formed in the upper and lower parts of the conductive film. These barrier metal films are comprised of titanium nitride or a laminated film of titanium and titanium nitride.

An interlayer insulating film IL2 is formed over the interlayer insulating film IL1 and over the line M1. The interlayer insulating film IL2 is comprised, for example, of silicon oxide. Further, a flattening process is applied to the upper surface of the interlayer insulating film IL2.

A contact hole CH3 reaching the line M1 is formed in the interlayer insulating film IL2. A conductive film CF2 is formed inside the contact hole CH3 through a barrier metal film BM2. The barrier metal film BM2 is formed of a laminated film of a metal film such as titanium and a metal nitride film such as titanium nitride formed over the metal film. Here, the film thickness of the metal film is, for example, about 10 to 20 nm and the film thickness of the metal nitride film is, for example, about 10 to 20 nm. The conductive film CF2 is comprised, for example, of tungsten. The barrier metal film BM2 and the conductive film CF2, which are formed inside the contact hole CH3, configure a plug PG2.

A line M2 that is coupled to the plug PG2 is formed over the interlayer insulating film IL2. For example, the line M2 is comprised of an aluminum-based conductive film as well as barrier metal films respectively formed in the upper and lower parts of the conductive film. These barrier metal films are comprised, for example, of titanium nitride or a laminated film of titanium and titanium nitride.

An insulating film IF2 is formed over the interlayer insulating film IL2 and over the line M2. The insulating film IF2 is mainly comprised of a highly moisture resistant material for the purpose of preventing water penetration. For example, the insulating film IF2 is a single-layer film of silicon nitride or silicon oxide film, or a laminated film in which a silicon nitride film is formed over a silicon oxide film. An opening OP reaching the line M2 is formed in the insulating film IF2. The opening OP exposes part of the upper surface of the line M2. The line M2 exposed from the opening OP is the area to couple to a terminal for external connection such as wire bonding or bump electrode, which becomes a pad electrode.

<Manufacturing Method of Semiconductor Device>

The manufacturing method of semiconductor device according to the present embodiment will be described with reference to FIGS. 2 to 10.

Figure 2:
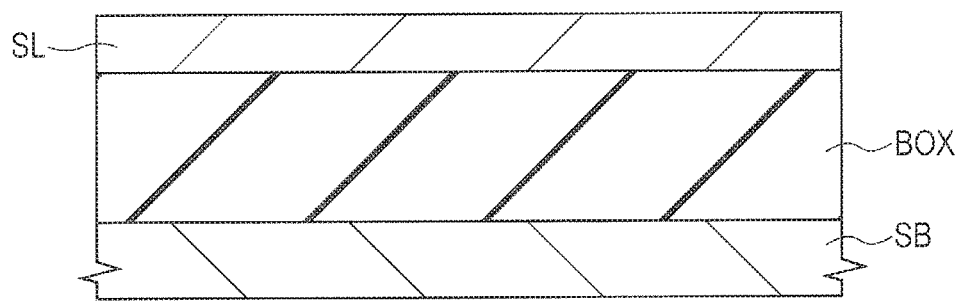
FIG. 2 is a cross-sectional view showing a manufacturing process of the semiconductor device according to the first embodiment.

First, as shown in FIG. 2, an SOI substrate is prepared having a semiconductor substrate SB which is a supporting substrate, an insulating layer BOX formed over the semiconductor substrate SB, and a semiconductor layer SL formed over the semiconductor substrate SB through the insulating layer BOX.

An example of a process of preparing such an SOI substrate is described below. The SOI substrate can be formed, for example, by a bonding method. In the bonding method, the insulating layer BOX is formed by oxidizing the surface of a first semiconductor substrate of silicon, and then a second semiconductor substrate of silicon is pressure-bonded to the insulating layer BOX under high temperature. Then, the second semiconductor substrate is thinned. In this case, the thin film of the second semiconductor substrate remaining over the insulating layer BOX becomes the semiconductor layer SL, and the first semiconductor substrate below the insulating film BOX becomes the semiconductor substrate SB.

Figure 3:
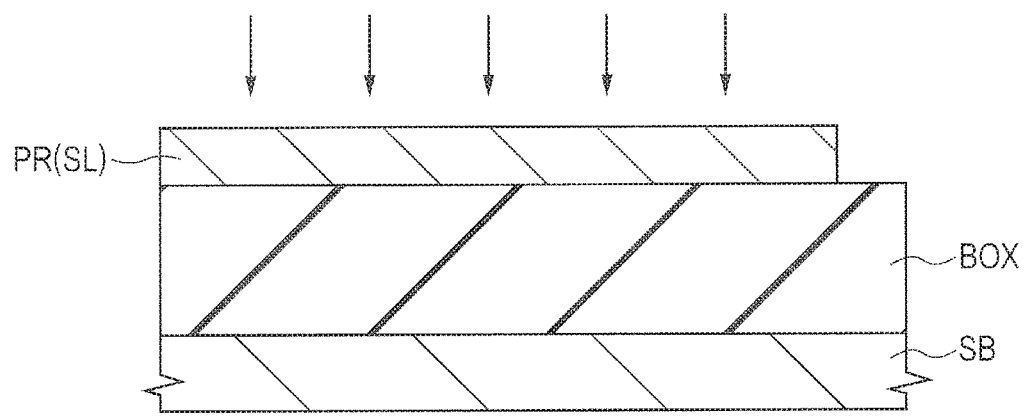
FIG. 3 is a cross-sectional view showing the manufacturing process flowing FIG. 2.

FIG. 3 shows a patterning process of the semiconductor layer SL and a formation process of the semiconductor layer SL.

First, the semiconductor layer SL is selectively patterned by using photolithography and dry etching. Note that only the photoelectric conversion unit is shown in the present embodiment. However, the optical waveguide or the like is formed by this patterning in other areas not shown.

Next, the p-type semiconductor layer PR is formed by introducing an impurity, such as boron or boron difluoride, into the semiconductor layer SL by using photolithography and ion implantation. Note that in the present embodiment, the semiconductor layer SL is first patterned and then the semiconductor layer PR is formed by ion implantation. However, their formation order can be reversed.

Figure 4:
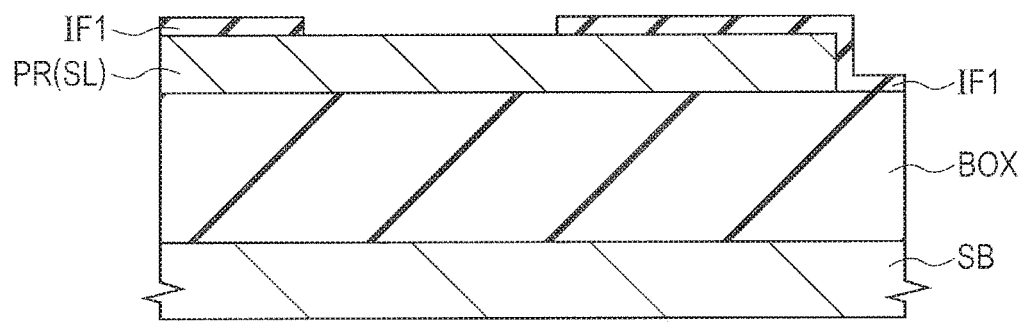
FIG. 4 is a cross-sectional view showing the manufacturing process following FIG. 3.

FIG. 4 shows the formation process of the insulating film IF1.

First, the insulating film IF1 of, for example, silicon oxide or silicon nitride is formed so as to cover the semiconductor layer PR by, for example, CVD (Chemical Vapor Deposition) method. Next, a through part is formed in the insulating film IF1 by selectively patterning the insulating film IF1 by using photolithography and dry etching. Part of the upper surface of the semiconductor layer PR is exposed within the through part.

Figure 5:
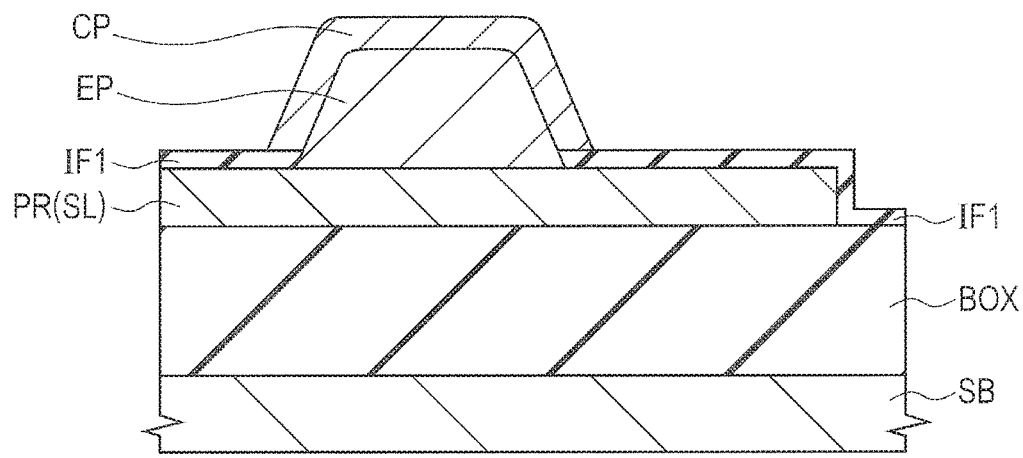
FIG. 5 is a cross-sectional view showing the manufacturing process following FIG. 4.

FIG. 5 shows the formation process of the semiconductor layer EP and the cap layer (semiconductor layer) CP.

First, the semiconductor layer EP of, for example, germanium (Ge) is formed over the upper surface of the semiconductor layer PR exposed from the insulating film IF1, and the cap layer CP of, for example, silicon (Si) is formed over the semiconductor layer EP. The semiconductor layer EP and the cap layer CP are formed sequentially by epitaxial growth. The film thickness of the semiconductor layer EP is about 300 nm to 1 μm. The film thickness of the cap layer CP is about 20 to 50 nm. Further, each of the semiconductor layer EP and the cap layer CP is i-type semiconductor layer.

Figure 6:
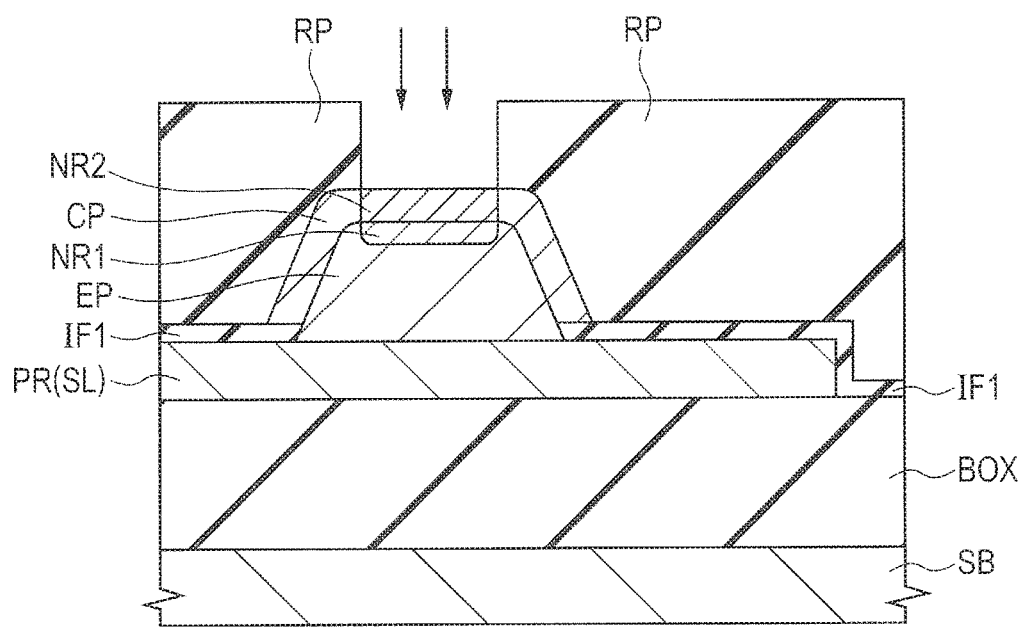
FIG. 6 is a cross-sectional view showing the manufacturing process following FIG. 5.

FIG. 6 shows the formation process of the semiconductor layer NR1 and the semiconductor layer NR2.

First, a resist pattern RP is formed having a pattern that opens part of the upper surface of the cap layer CP. Next, an impurity such as arsenic or phosphorus is introduced into part of the cap layer CP and part of the semiconductor layer EP by ion implantation with the resist pattern RP as a mask. In this way, part of the cap layer CP becomes the n-type semiconductor layer NR2 and part of the semiconductor layer EP becomes the n-type semiconductor layer NR1. Further, for example, the semiconductor layer NR1 is formed in the region extending from the upper surface of the semiconductor layer EP to a depth of about 20 to 30 nm. In other words, the film thickness of the semiconductor layer NR1 is, for example, about 20 to 30 nm.

As described above, the photoreceiver of the pin junction structure having the semiconductor layer PR and the semiconductor layer EP including the semiconductor layer NR1 is formed.

Figure 7:
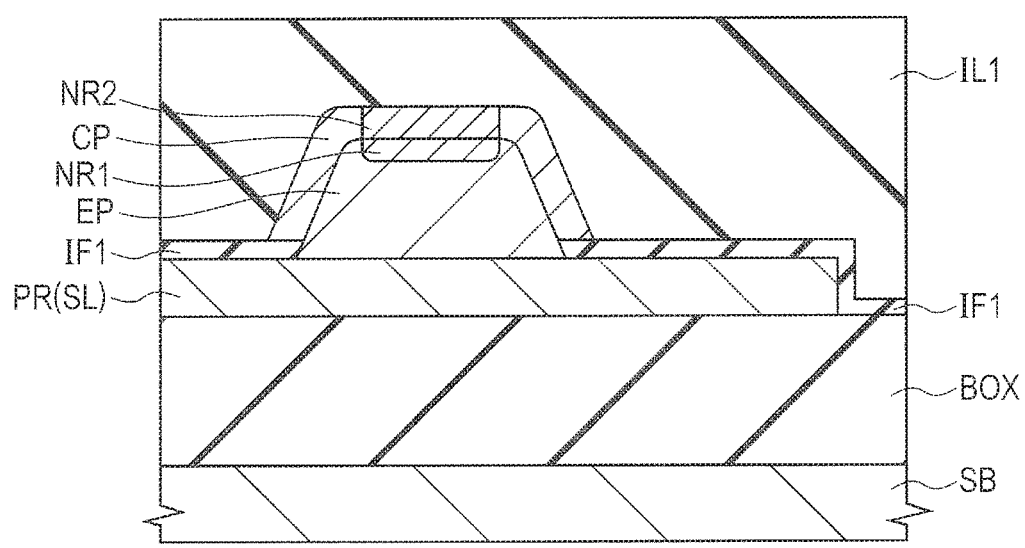
FIG. 7 is a cross-sectional view showing the manufacturing process following FIG. 6.

FIG. 7 shows the formation process of the interlayer insulating film IL1.

First, the interlayer insulating film IL1 of, for example, silicon oxide is formed over the cap layer CP and over the insulating film IF1, for example, by the CVD method. Next, the upper surface is flattened by polishing the interlayer insulating film IL1 by CMP (Chemical Mechanical Polishing) method. Note that this flattening process is not necessarily performed.

Figure 8:
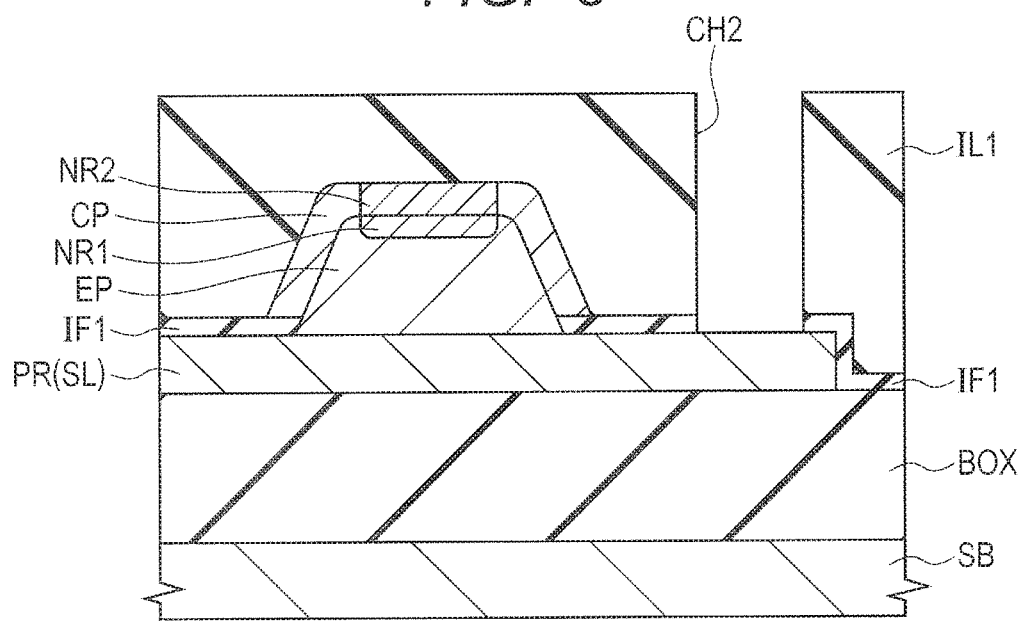
FIG. 8 is a cross-sectional view showing the manufacturing process following FIG. 7.

FIG. 8 shows the formation process of the contact hole CH2.

First, the contact hole CH2 reaching the semiconductor layer PR is formed in both the interlayer insulating film IL1 and the insulating film IF1 by using photolithography and dry etching.

Figure 9:
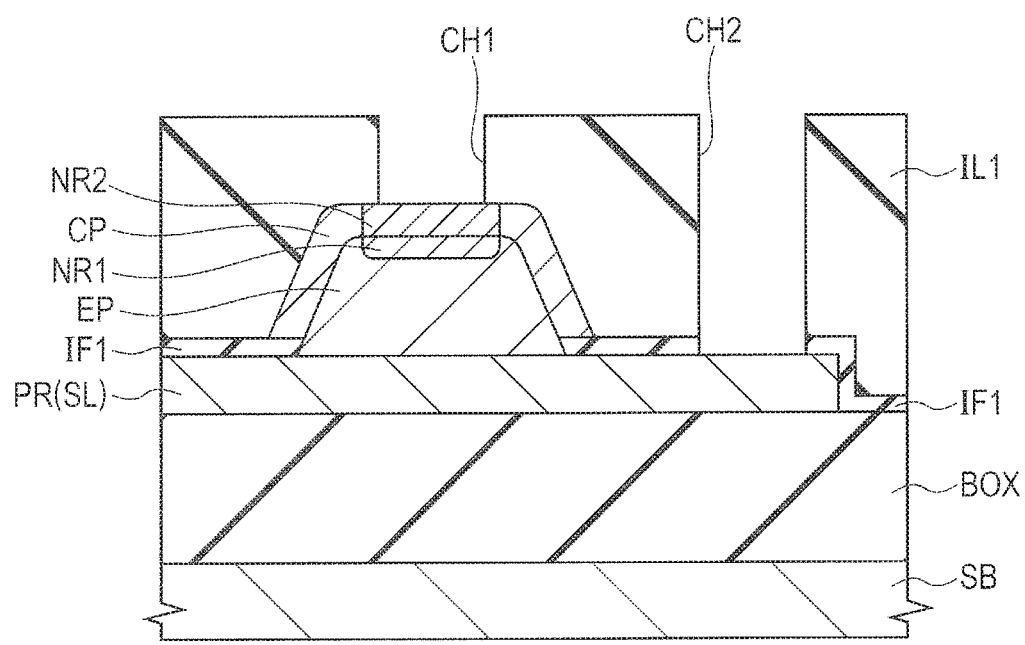
FIG. 9 is a cross-sectional view showing the manufacturing process following FIG. 8.

FIG. 9 shows the formation process of the contact hole CH1.

First, the contact hole CH1 reaching the semiconductor layer NR2 is formed in the interlayer insulating film IL1 by using photolithography and dry etching. Note that in the present embodiment, the contact hole CH2 is formed first and then the contact hole CH1 is formed second. However, their formation order can be reversed.

Further, in the present embodiment, the contact hole CH1 and the contact hole CH2 are formed separately in different processes. However, the contact hole CH1 and the contact hole CH2 can be formed in the same process. In this case, the same mask can be used. Thus, not only the manufacturing cost can be reduced but also the manufacturing process can be simplified.

However, in this case, the dry etching process is performed until the contact hole CH2 reaches the semiconductor layer PR even after the contact hole CH1 reaches the semiconductor layer NR2. As a result, the semiconductor layer NR2 is subjected to an excessive dry etching process and the surface of the semiconductor layer NR2 may be removed. Thus, in consideration of removal in the etching process, it is desirable that the film thickness of the semiconductor layer NR2 (cap layer CP) is thick. In the following formation process of the silicide layer SI1, the film thickness of the semiconductor layer NR2 should be sufficiently large to ensure that the semiconductor layer NR1 is not germanided. For this reason, it is not desirable that the surface of the semiconductor layer is removed backward. For the above reasons, in order to ensure that the semiconductor layer NR2 has sufficient film thickness, it is desirable that the formation process of the contact hole CH1 and the formation process of the contact hole CH2 are performed separately as described in FIGS. 8 and 9 of the present embodiment.

Figure 10:
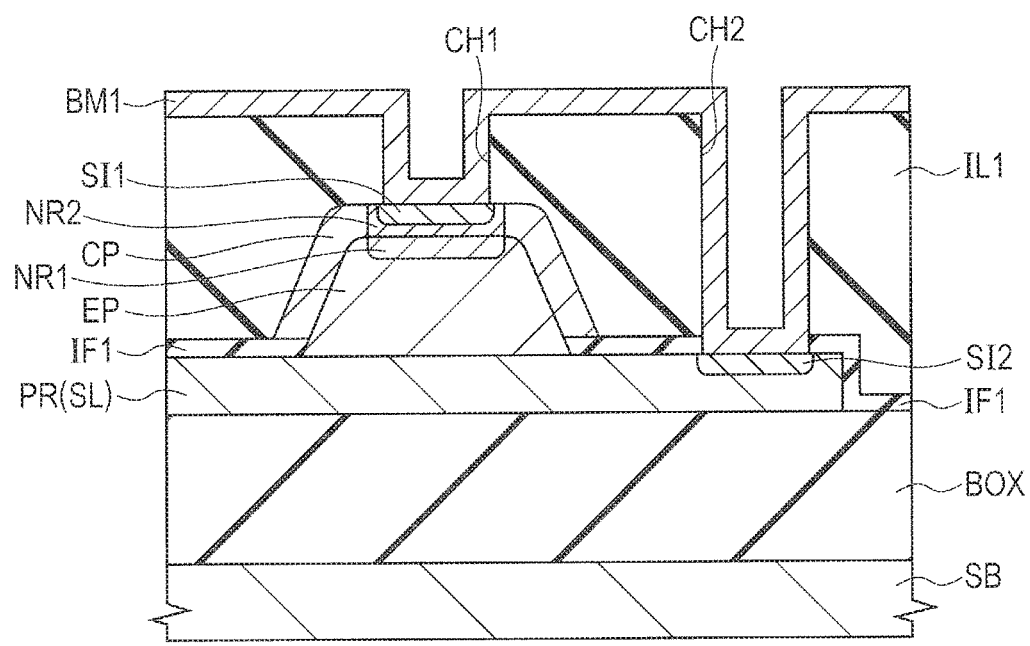
FIG. 10 is a cross-sectional view showing the manufacturing process following FIG. 9.

FIG. 10 shows the formation process of the barrier metal film BM1, the silicide layer SI1, and the silicide layer SI2.

First, a metal film of, for example, titanium (Ti) is formed over the interlayer insulating film IL1 and inside the contact hole CH1 and the contact hole CH2, for example, by the sputtering method. Next, a metal nitride film of, for example, titanium nitride (TiN) is formed over the metal film, for example, by the CVD or sputtering method. The film thickness of the metal film is, for example, about 10 to 20 nm, and the film thickness of the metal nitride film is, for example, about 10 to 20 nm. The barrier metal film BM1 is comprised of these metal films and the metal nitride film.

In this process, the formation of barrier metal film BM1 as well as the heat treatment for silicide layer formation are performed to form the barrier metal film BM1, and at the same time, the silicide layer SI1 is formed by reaction of the semiconductor material included in the semiconductor layer NR2 (cap layer CP) with the metal. Then, the silicide layer SI2 is formed by reaction of the material included in the semiconductor layer PR with the metal. The heat treatment is performed in an inert gas atmosphere such as nitrogen atmosphere, for example, in a range of temperature from 400 to 700° C. for a range of time from 30 seconds to 5 minutes. For example, when the temperature is 400° C. and the time is 3 minutes, the thickness of the silicide layer SI1 is about 10 nm, and when the temperature is 600° C. and the time is 3 minutes, the thickness of the silicide layer SI1 is 30 nm or more.

Note that the formation process of the barrier metal film BM1 and the formation process of the silicide layer SI1 can be the same process as described in the present embodiment, but these formation processes may be different from each other. When the formation process of the barrier metal film BM1 and the formation process of the silicide layer SI1 are different, for example, the heat treatment is first performed at a temperature from room temperature to 200° C. in the process of forming the barrier metal film BM1. However, the formation of the silicide layer SI1 is not sufficiently performed by the heat treatment. Thus, the heat treatment for silicide layer formation is performed separately. In other words, the heat treatment for silicide layer formation is performed at a temperature higher or for a longer time than in the formation process of the barrier metal film BM1.

In the silicide layer formation process, it is important that the thickness of the silicide layer SI1 is controlled to be smaller than the film thickness of the cap layer CP. In the present embodiment, the thickness of the silicide layer SI1 is equal to the thickness of the silicide layer SI2, or about 10 to 30 nm, in the range smaller than the film thickness of the cap layer CP. In other words, the bottom surface of the silicide layer SI1 is located within the semiconductor layer NR2 and does not reach the semiconductor layer NR1. In the silicide layer formation process, the heart treatment conditions such as heating temperature and heating time are determined in a range in which the thickness of the silicide layer SI1 can be controlled to be smaller than the film thickness of the cap layer CP. The heat treatment conditions are determined as appropriate based on conditions such as the material configuring the barrier metal film BM1 as well as the film thickness of the cap layer CP.

Figure 11:
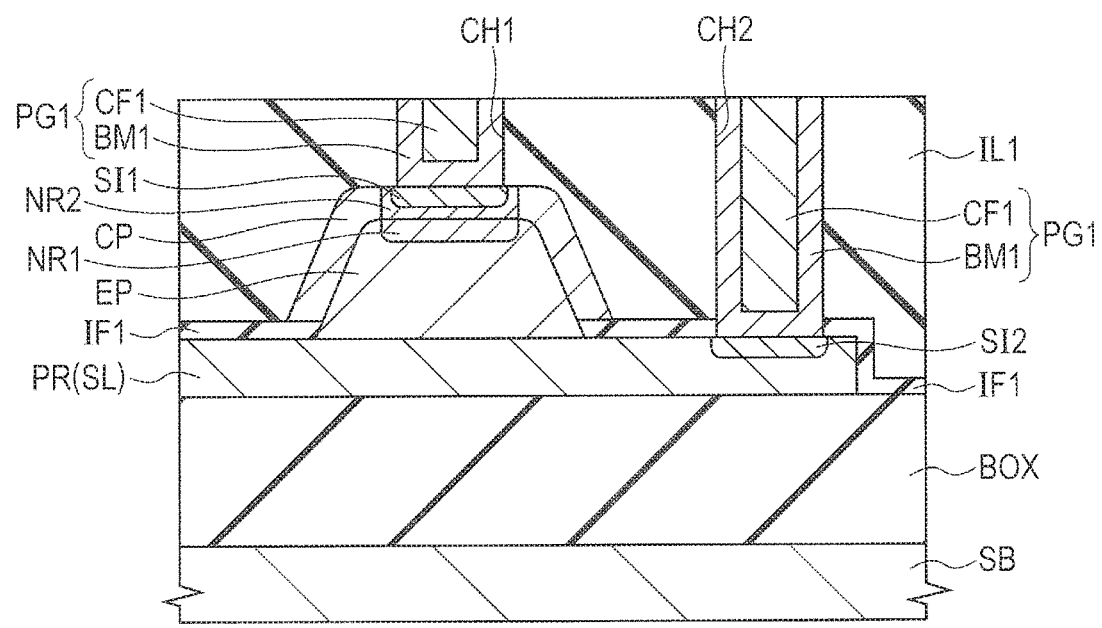
FIG. 11 is a cross-sectional view showing the manufacturing process following FIG. 10.

FIG. 11 shows the formation process of the conductive film CF1 and the plug PG1.

First, the conductive film CF1 of, for example, tungsten is formed over the barrier metal film BM1, for example, by the CVD method. Next, the conductive film CF1 and the barrier metal film BM1, which are formed outside the contact hole CH1 and the contract hole CH2, are removed by using CMP or dry etching. In this way, the plug PG1 is formed that includes the conductive film CF1 and the barrier metal film BM1 that are left inside the contact hole CH1 and the contact hole CH2.

Then, the semiconductor device shown in FIG. 1 is manufactured by forming the line M1, the interlayer insulating film IL2, the plug PG2, the line M2, the insulating film IF2, and the opening OP. The manufacturing process is described below.

First, a lower layer barrier metal film of titanium nitride or of a laminated film of titanium and titanium nitride is formed over the interlayer insulating film IL1, for example, by the sputtering method. Next, an aluminum-based conductive film is formed over the lower layer conductive film, for example, by the sputtering method. Next, an upper layer barrier metal film of titanium nitride or of a laminated layer of titanium and titanium nitride is formed over the conductive film, for example, by the sputtering method. Next, the line M1 that is coupled to the plug PG1 is formed by patterning the upper layer barrier metal film, the conductive film, and the lower layer barrier metal film by photolithograph and dry etching.

Next, the interlayer insulating film IL2 of, for example, silicon oxide is formed over the interlayer insulating film IL1 and over the line M1, for example, by using the CVD method. Next, the flattening process is applied to the interlayer insulating film IL2 by the CMP method.

Next, the contact hole CH3 reaching the line M1 is formed in the interlayer insulating film IL2 by photolithography and dry etching. Next, the barrier metal film BM2 is formed inside the contact hole CH3 by the sputtering method. The barrier metal film BM2 is formed of, for example, a laminated film of a metal film, such as of titanium, and a metal nitride film, such as of titanium nitride, formed over the metal film. Next, the conductive film CF2 of, for example, tungsten is formed over the barrier metal film BM2, for example, by the CVD method. Next, the conductive film CF2 and the barrier metal film BM2, which are formed outside the contact hole CH3, are removed by CMP or dry etching. In this way, the plug PG2 is formed having the conductive film CF2 and the barrier metal film BM2 that are left inside the contact hole CH3.

Next, the ling M2 that is coupled to the plug PG2 is formed over the interlayer insulating film IL2. The formation process, the material, and the like of the line M2 are the same as those of the line M1.

Next, the insulating film IF2 of, for example, silicon nitride or silicon oxynitride is formed over the interlayer insulating film IL2 and over the line M2, for example, by the CVD method.

Next, the opening OP is formed in the insulating film IF2 in such a way that the opening OP reaches the line M2 and exposes part of the upper surface of the line M2.

As described above, the semiconductor device shown in FIG. 1 is manufactured.

<Semiconductor Devices in Study Examples>

Semiconductor devices studied by the present inventors in study example 1 and study example 2 are described below, respectively, with reference to FIGS. 19 and 20.

Figure 19:
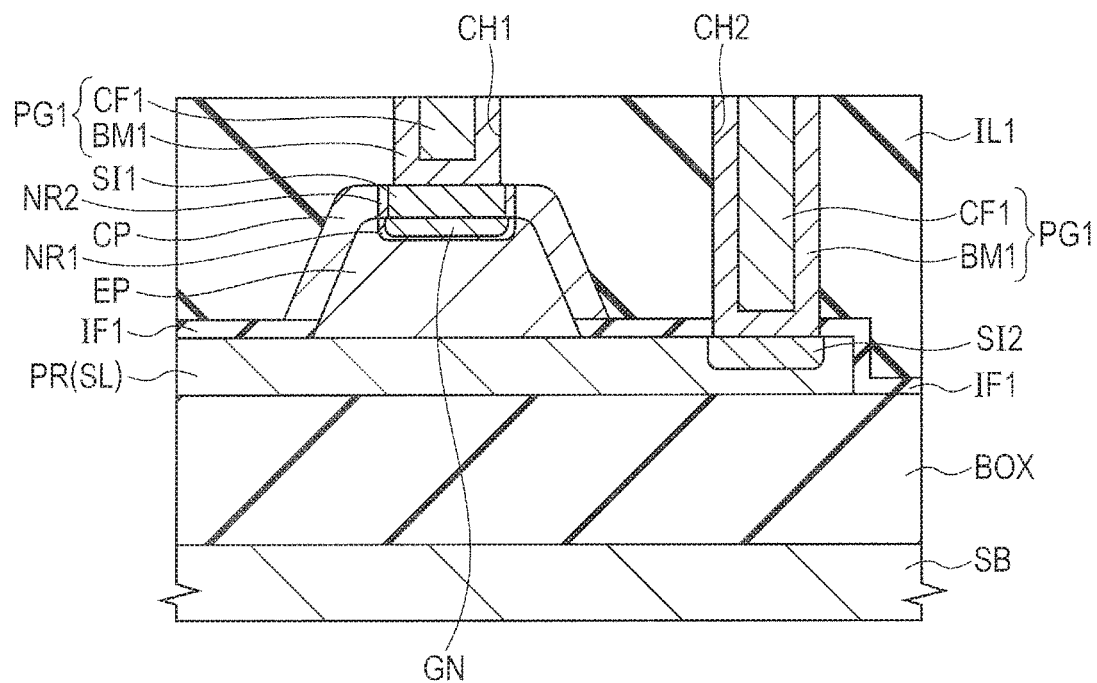
FIG. 19 is a fragmentary cross-sectional view showing a semiconductor device of a first study example.

FIG. 19 is a cross-sectional view of the semiconductor device of the first study example, which shows similar to the present embodiment the photoreceiver including the p-type semiconductor PR, the i-type semiconductor layer EP of germanium, and the n-type semiconductor layer NR1 formed near the surface of the semiconductor layer EP.

As shown in FIG. 19, also in the first study example, similar to the present embodiment, the silicide layer (compound layer) SI1 is formed inside the cap layer CP (semiconductor layer NR2). However, in the first study example, different from the present embodiment, the germanide layer (compound layer) GN is formed in the semiconductor layer NR1 below the silicide layer SI1. The germanide layer GN is formed by promoting the formation of silicide by increasing the temperature of heat treatment for the formation of the silicide layer SI1, or by increasing the duration of the heat treatment. In other words, when the silicide layer SI1 is grown so as to reach not only within the semiconductor layer NR2 but also within the semiconductor layer NR1, germanium included in the semiconductor layer NR1 reacts with titanium included in the metal film. In this way, TiGe which is a reaction product of germanium and titanium is formed, as the germanide layer GN, within the semiconductor layer NR1.

According to the study by the present inventors, the germanide layer GN is effective in reducing the contact resistance between the plug PG1 and the semiconductor layers NR2 and NR1. However, the germanide layer GN configures a leakage path of current within the semiconductor layer NR1. The leakage path may not stay the n-type semiconductor layer NR1 and may even reach the i-type semiconductor layer EP. For this reason, the dark current increases in terms of the photoreceiver.

In addition, when the germanide layer GN is present within the semiconductor layer NR1, the impurity concentration introduced into the semiconductor layer NR1 may even be pushed out to the side of the semiconductor layer EP. This leads to a problem that the impurity concentration changes within the semiconductor layer NR1 or the impurity is diffused into the semiconductor layer EP, resulting in a change in the impurity concentration profile that configures the semiconductor layer NR1.

Figure 20:
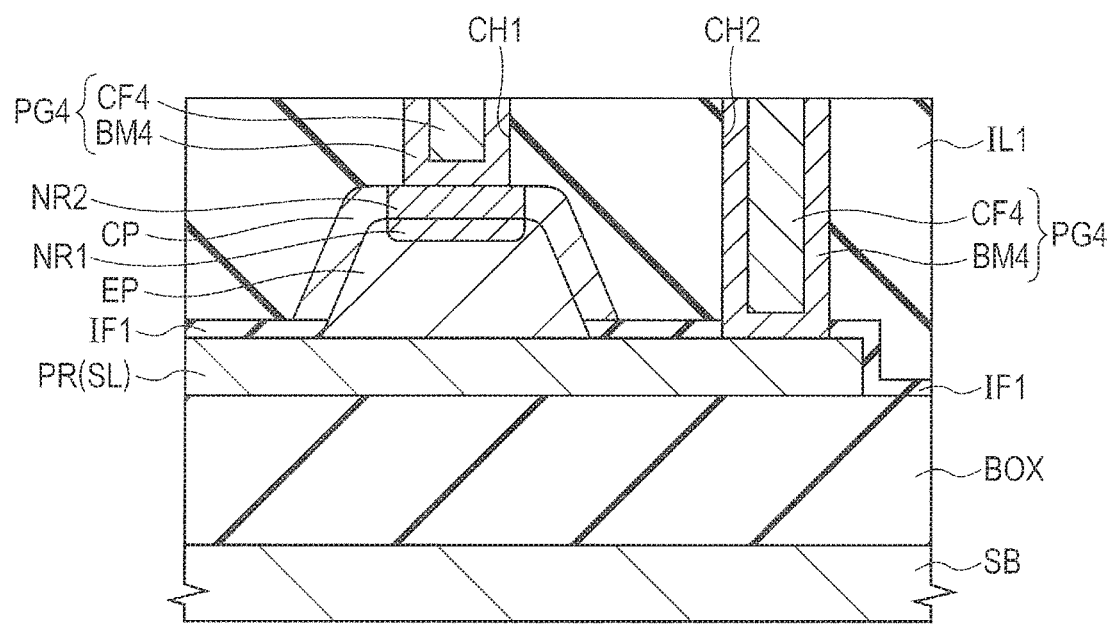
FIG. 20 is a fragmentary cross-sectional view showing a semiconductor device of a second study example.

FIG. 20 is a cross-sectional view of the semiconductor device of the second study example, which shows similar to the present embodiment the photoreceiver including the p-type semiconductor layer PR, the i-type semiconductor layer EP of germanium, and the n-type semiconductor layer NR1 formed near the surface of the semiconductor layer EP.

As shown in FIG. 20, in the second study example, a plug PG4 is formed of a material different from the plug PG1 of the present embodiment. A barrier metal film BM4 configuring the plug PG4 is a single-layer film of, for example, titanium nitride. A conductive film CF4 is, for example, tungusten. The titanium nitride does not promote the formation of silicide even if the heat treatment for silicide formation is applied as in the present embodiment. For this reason, in the second study example, different from the present embodiment and the first study example, the silicide layer SI1 is not formed within the semiconductor layer NR2 and within the semiconductor layer PR. Thus, unlike the first study example, the germanide layer GN is not formed within the semiconductor layer NR1, so that it is possible to prevent the problem of increasing dark current and the problem of changing the impurity concentration profile.

However, in the second study example, also the silicide layer SI1 is not formed. As a result, the contact resistance between the plug PG4 and the semiconductor layer NR2 increases, and the contact resistance between the plug PG4 and the semiconductor layer PR increases.

As described above, in the first and second study examples, there is a problem of reducing the performance of the semiconductor device.

Main Features of the Present Embodiment

The main features of the present embodiment are that the silicide layer SI1 which is the reaction product of the material configuring the semiconductor layer NR2 (cap layer CP) and a metal is formed within the semiconductor layer NR2 located below the plug PG1, while the germanide layer GN which is the reaction product of the material configuring the semiconductor layer NR1 and the metal is not formed within the semiconductor layer NR1.

In the present embodiment, different from the first study example, the film thickness of the silicide layer SI1 is smaller than the film thickness of the cap layer CP. More specifically, the bottom surface of the silicide layer SI1 is located within the semiconductor layer NR2 and not within the semiconductor NR1. In other words, the bottom surface of the silicide layer SI1 is located on the side of the semiconductor layer NR2 from the interface between the semiconductor layer NR2 and the semiconductor layer NR1.

Further, in the present embodiment, in the area just below the plug PG1, the silicide layer SI1, the semiconductor layer NR2, the semiconductor layer NR1, the semiconductor layer EP, and the semiconductor layer PR are formed in this order from the upper side. Then, the photoreceiver of pin junction structure is configured at least with the semiconductor layer NR1, the semiconductor layer EP, and the semiconductor layer PR.

As described above, the germanide layer GN, such as TiGe layer shown in the first study example, is not formed within the semiconductor layer NR1. Thus, it is possible to prevent the problem of forming a leakage path within the semiconductor layer NR1 and increasing the dark current, and also possible to prevent the problem of changing the impurity concentration profile. Further, because the silicide layer SI1 is present within the semiconductor layer NR2, it is possible to reduce the resistance below the plug PG1.

In other words, according to the present embodiment, it is possible to reduce the dark current, prevent the impurity concentration profile from changing, and reduce the resistance below the plug PG1 all at the same time. Thus, the performance of the semiconductor device can be improved.

Further, as described in FIGS. 8 and 9, according to the present embodiment, the formation process of the contact hole CH1 and the formation process of the contact hole CH2 are performed separately, so that it is possible to maintain a sufficient film thickness of the cap layer CP. Thus, the silicide layer SI1 can be easily formed within the semiconductor layer NR2 in the formation process of the silicide layer SI1 described in FIG. 10, and the formation of the germanide layer GN in the semiconductor layer NR1 can be prevented.

Further, according to the present embodiment, the formation process of the silicide layer SI1 described in FIG. 10 is performed by using the formation process of the barrier metal film BM1 which becomes part of the plug PG1. Thus, the silicide layer SI1 can be formed by only minimal additional processes without the need to prepare an additional mask or the like, and the production cost increase can be minimized.

Variation

A semiconductor device of a variation of the first embodiment will be described below with reference to FIG. 12. Note that the following mainly describes differences from the first embodiment. Further, the features of the variation reside in the semiconductor layer NR1, the semiconductor layer PR, and their surrounding structure, and thus the structure of the upper layer above the line M1 is not shown in the figure.

In the first embodiment, the silicide layer SI1 is formed within the cap layer CP (semiconductor layer NR2) in such a way that the silicide layer SI1 does not reach the semiconductor layer NR1. In other words, the semiconductor layer NR2 is present between the silicide layer SI1 and the semiconductor layer NR1.

Figure 12:
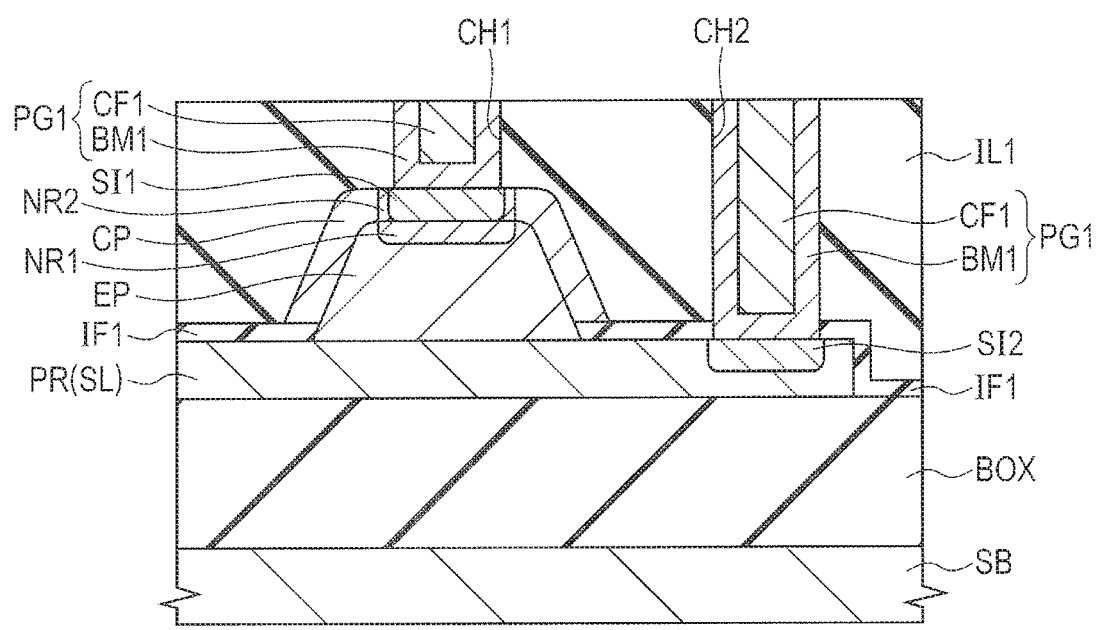
FIG. 12 is a fragmentary cross-sectional view of a semiconductor device according to a variation of the first embodiment.

In this variation, as shown in FIG. 12, the silicide layer SI1 is formed in the whole semiconductor layer NR2 in the lower part of the plug PG1 in such a way that the silicide layer SI1 comes into contact with the semiconductor layer NR1. In other words, the silicide layer SI1 directly comes into contact with the semiconductor layer NR1. Thus, in the region just below the plug PG1, the silicide layer SI1, the semiconductor layer NR1, the semiconductor layer EP, and the semiconductor layer PR are formed in this order from the upper side.

Further, such a silicide layer SI1 can be formed by controlling heat treatment conditions in the formation process of the silicide layer SI1 described in FIG. 10 so that the germanide layer GN is not formed within the semiconductor layer NR1.

In this variation, as compared to the first embodiment, the thickness of the silicide layer SI1 is large and the semiconductor layer NR2 with a resistance higher than the silicide layer SI1 is virtually absent between the silicide layer SI1 and the semiconductor layer NR1. Thus, in this variation, it is possible to reduce the resistance below the plug PG1 more than in the first embodiment.

Further, the silicide layer SI1 is formed in the same process as for the silicide layer SI2 formed in the semiconductor layer PR. For this reason, in this variation, the film thickness of the silicide layer SI2 can also be made large. Thus, in this variation, the contact resistance between the semiconductor layer PR and the plug PG1 can be further reduced compared to the first embodiment.

Second Embodiment

A semiconductor device of a second embodiment and its manufacturing method are described below with reference to FIGS. 13 to 16. Note that the following mainly describes differences from the first embodiment. Further, the features of the second embodiment reside in the semiconductor layer NR1, the semiconductor layer PR, and their surrounding structure, and thus the structure of the upper layer above the line M1 is not shown in the figures.

In the first embodiment, as described in FIGS. 10 and 11, the plug PG1 formed over the semiconductor layer PR includes the barrier metal film BM1 and the conductive film CF1, and has the same structure as the plug PG1 formed over the semiconductor layer NR2.

Figure 13:
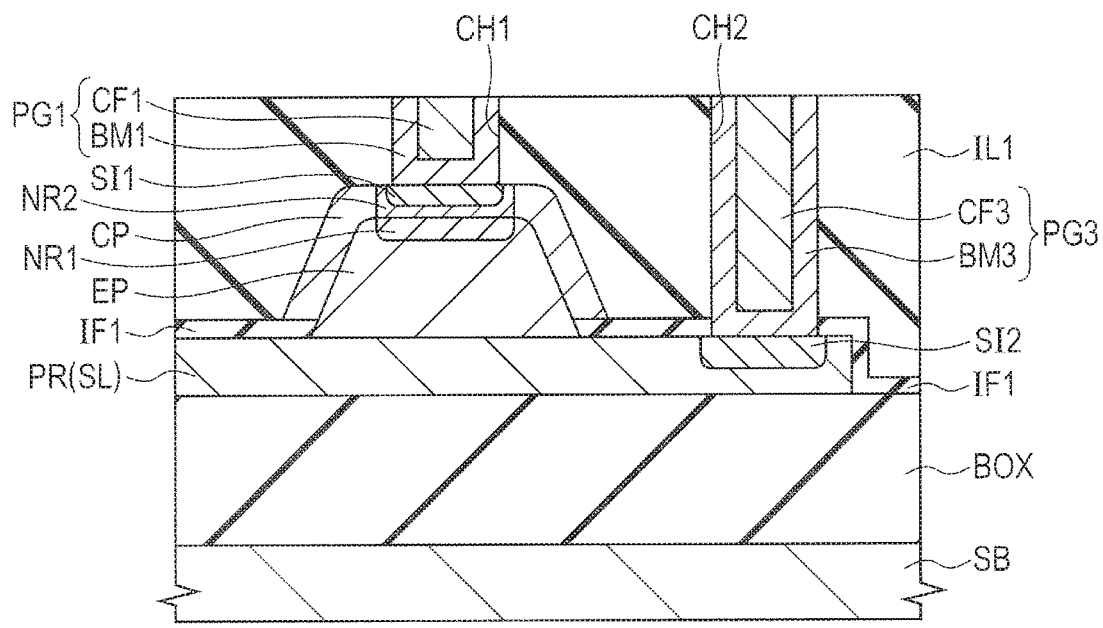
FIG. 13 is a fragmentary cross-sectional view of a semiconductor device according to a second embodiment.

On the other hand, in the second embodiment, as shown in FIG. 13, a plug PG3 formed over the semiconductor layer PR has a structure different from the structure of the plug PG1 formed over the semiconductor layer NR2.

The manufacturing method of the second embodiment is described below with reference to FIGS. 14 to 16.

Figure 14:
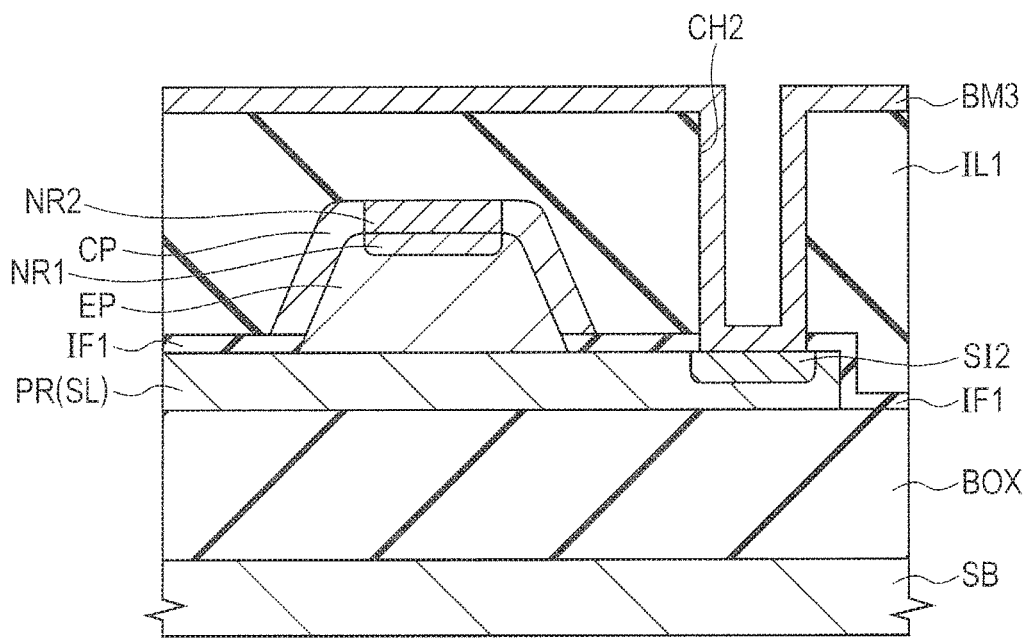
FIG. 14 is a cross-sectional view showing a manufacturing process of the semiconductor device according to the second embodiment.

FIG. 14 shows the manufacturing process following FIG. 8 of the first embodiment. As shown in FIG. 14, after the contact hole CH2 is formed in the interlayer insulating film IL1, a barrier metal film BM3 is formed over the interlayer insulating film IL1 and inside the contact hole CH2. The formation process of the barrier metal film BM3 is as follows: First, a metal film of, for example, titanium (Ti) is formed, for example, by the sputtering method. Next, a metal nitride film of, for example, titanium nitride (TiN) is formed over the metal film, for example, by the CVD method or sputtering method. Here, the film thickness of the metal film is, for example, about 10 to 20 nm, and the film thickness of the metal nitride film is, for example, about 10 to 20 nm. The barrier metal film BM3 is configured with the metal film and the metal nitride film.

Then, the silicide layer SI2 is formed by reaction of the material included in the semiconductor layer PR with the metal by heat treatment. The heat treatment is performed in an inert gas atmosphere such as nitrogen atmosphere, for example, in a range of temperature from 400 to 700° C. for a range of time from 30 seconds to 5 minutes. Here, the thickness of the silicide layer SI2 is, for example, about 20 to 50 nm, which can be made greater than the thickness of the silicide layer SI1 described below.

Figure 15:
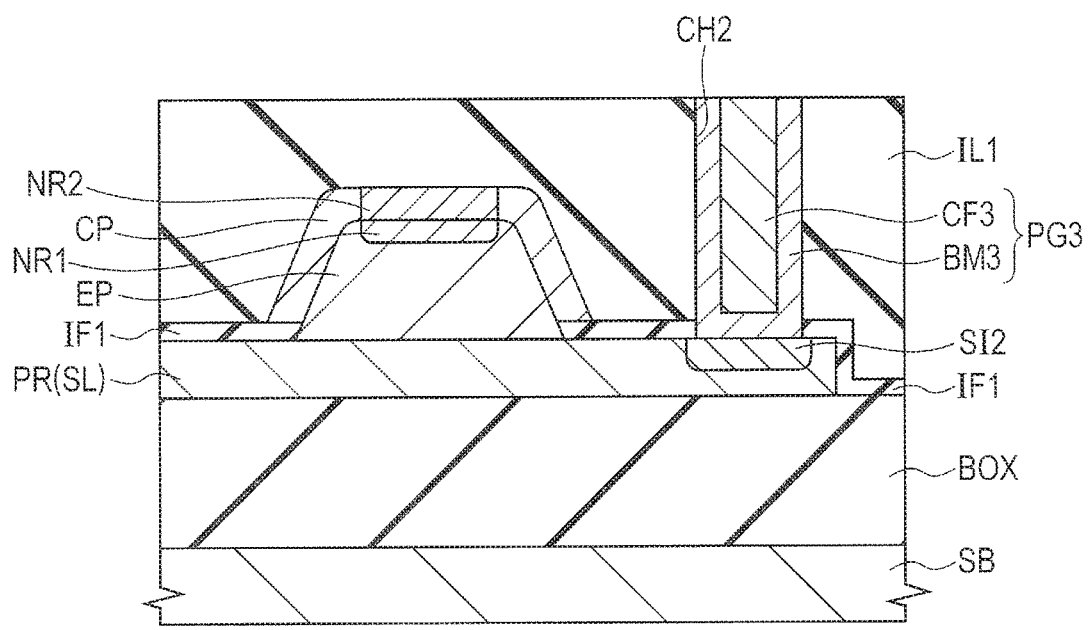
FIG. 15 is a cross-sectional view showing the manufacturing process following FIG. 14.

Next, as shown in FIG. 15, a conductive film CF3 of, for example, tungsten is formed over the barrier metal film BM3, for example, by the CVD method. Next, the conductive film CF3 and the barrier metal film BM3, which are formed outside the contact hole CH2, are removed by using CMP or dry etching. In this way, the plug PG3 is formed having the conductive film CF3 and the barrier metal film BM3 that are left inside the contact hole CH2.

Figure 16:
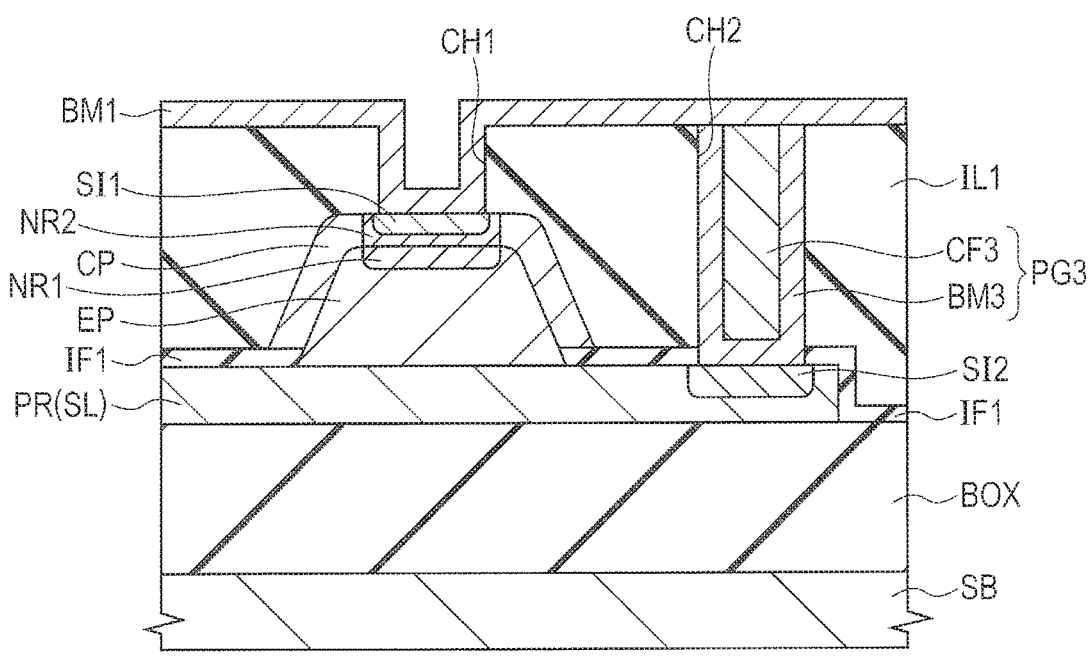
FIG. 16 is a cross-sectional view showing the manufacturing process following FIG. 15.

Next, as shown in FIG. 16, after the contact hole CH1 is formed in the interlayer insulating film IL1 by photolithography and dry etching, the barrier metal film BM1 is formed over the interlayer insulating film IL1 and inside the contact hole CH1. Then, the silicide layer SI1 is formed within the semiconductor layer NR2 by applying thermal treatment. The formation process of the barrier metal film BM1 and the silicide layer SI1 is the same as that of the first embodiment.

After the process of FIG. 16, the conductive film CF1 is formed over the barrier metal film BM1. Then, the conductive film CF1 and the barrier metal film BM1, which are formed outside the contact hole CH1, are removed by using CMP. Then, the plug PG1 is formed that includes the conductive film CF1 and the barrier metal film BM1 that are left inside the contact hole CH1. In this way, the structure shown in FIG. 13 is obtained.

As described above, in the second embodiment, the plug PG1 is not formed over the semiconductor layer PR. However, the plug PG3 different from the plug PG1 is formed over the semiconductor layer PR, and then the silicide layer SI2 is formed in the process different from the process for the silicide layer SI1. Thus, the number of manufacturing processes in the second embodiment is greater than that of the first embodiment.

However, in the second embodiment, the film thickness and manufacturing method of the silicide layer SI2 can be freely designed without depending on the thickness and manufacturing method of the silicide layer SI1.

For example, as described above, the film thickness of the silicide layer SI2 can be made greater than the film thickness of the silicide layer SI1. In the first embodiment and in the variation of the first embodiment, the film thickness of the silicide layer SI1 should be smaller than or equal to the thickness of the cap layer CP in order to prevent the semiconductor layer NR1 from being germanided. For this reason, the maximum thickness of the silicide layer SI2 depends on the maximum thickness of the silicide layer SI1.

On the other hand, in the second embodiment, the film thickness of the barrier metal film BM3 can be freely designed and the film thickness of the silicide layer SI2 can be freely designed. For this reason, the film thickness of the silicide layer SI2 can be made different from the thickness of the silicide layer SI1, and can even be greater than the film thickness of the cap layer CP. Thus, it is possible to further reduce the contact resistance between the semiconductor layer PR and the plug PG3.

Further, in the first embodiment, either of the formation process of the contact hole CH1 and the formation process of the contact hole CH2 can be performed first.

On the other hand, in the second embodiment, it is desirable that the plug PG3 inside the contact hole CH2 is formed first and then the plug PG1 is formed inside the contact hole CH1. In the second embodiment, forming the plug PG3 prior to the formation of the plug PG1 means that the silicide layer SI2 is formed prior to the formation of the silicide layer SI1. Then, in the second embodiment, it is necessary to perform the heat treatment separately for the formation of the silicide layer SI1 and for the silicide layer SI2.

Thus, if the contact hole CH1, the silicide layer SI1, and the plug PG1 are formed first, silicidation of the silicide layer SI1 will be promoted again afterwards by the heat treatment for the formation of the silicide layer SI2. In this case, there is a risk that the silicide layer SI1 may not stay within the semiconductor NR2 and the inside the semiconductor layer NR1 may be germanided. For this reason, it is difficult to increase the film thickness of the silicide layer SI2 as described above.

Thus, when the contact hole CH2, the silicide layer SI2, and the plug PG3 are formed first, even if silicidation of the silicide layer SI2 is promoted again afterwards by the heat treatment for the formation of the silicide layer SI1, the film thickness of the semiconductor layer PR is sufficiently large and the above problem does not occur. Thus, it is possible to improve the performance of the semiconductor device without damaging the reliability of the semiconductor device.

Note that the second embodiment has described the case in which the material of the barrier metal film BM3, the conductive film CF3, and the silicide layer SI2 is the same as the material of the barrier metal film BM1, the conductive film CF1, and the silicide layer SI2 in the first embodiment. However, the barrier metal film BM3, the conductive film CF3, and the silicide layer SI2 are not limited to the above material and can also be formed by other materials. In other words, it is possible that the material of the barrier metal film BM3, the conductive film CF3, and the silicide layer SI2, which are formed over the semiconductor layer PR, is different from the material of the barrier metal film BM1, the conductive film CF1, and the silicide layer SI1 which are formed over the semiconductor layer NR2.

Third Embodiment

A semiconductor device of a third embodiment and its manufacturing method are described below with reference to FIGS. 17 and 18. Note that the following mainly describes differences from the first embodiment. Further, the features of the third embodiment reside in the semiconductor layer NR1, the semiconductor layer PR, and their surrounding structure, and thus the structure of the upper layer above the line M1 is not shown in the figures.

In the first embodiment, as describe in FIG. 10, the silicide layer SI1 is formed by reaction between the material included in the semiconductor layer NR2 (cap layer CP) and the metal included in the barrier metal film BM1, and the silicide layer SI2 is formed by reaction between the metal included in the semiconductor layer PR and the metal included in the barrier metal film BM1.

On the other hand, in the third embodiment, a silicide layer SI3 is formed by using another metal film without using the metal film that configures the barrier metal film BM1.

Figure 17:
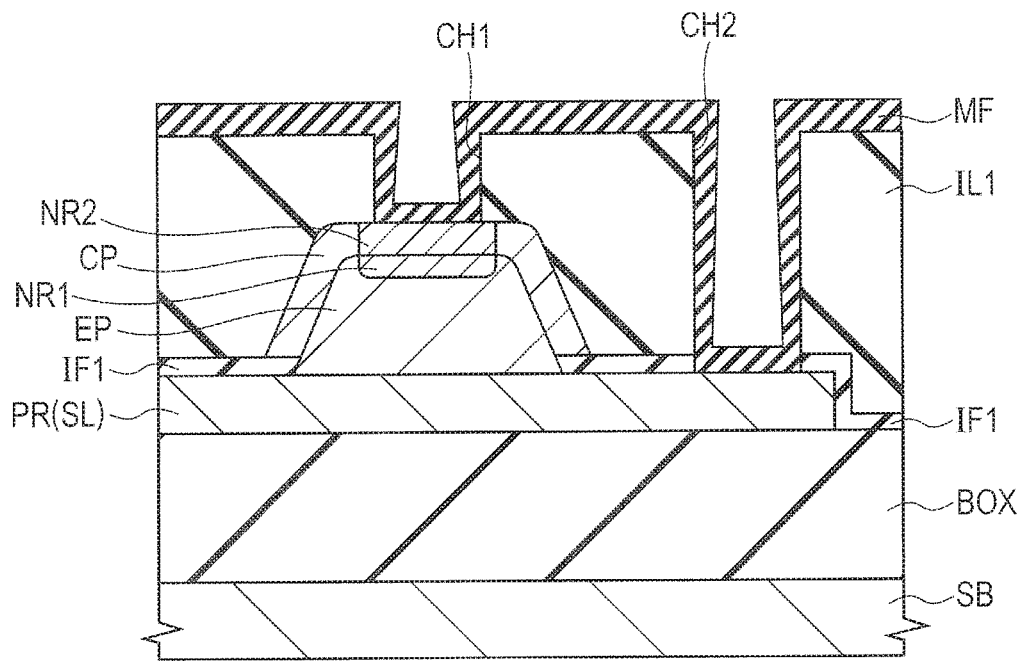
FIG. 17 is a cross-sectional view showing a manufacturing process of a semiconductor device according to a third embodiment.

FIG. 17 shows the manufacturing process following FIG. 9 of the first embodiment. As show in FIG. 17, a metal film MF including metal such as cobalt (Co), nickel (Ni), or platinum (Pt) is formed inside the contact hole CH1 and inside the contact hole CH2, over the interlayer insulating film IL1, by the sputtering method.

Figure 18:
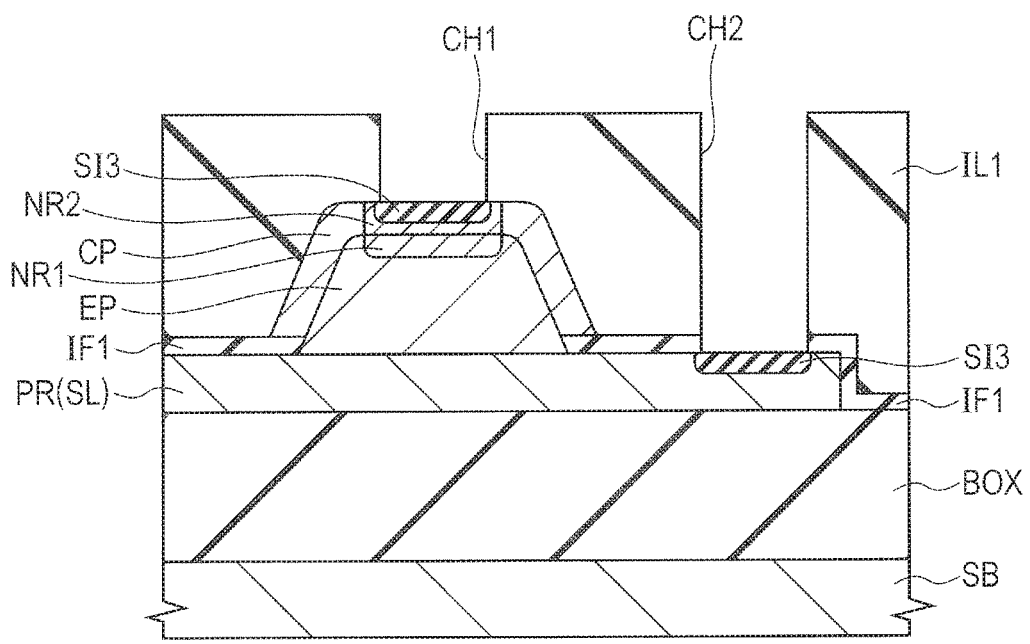
FIG. 18 is a cross-sectional view showing the manufacturing process following FIG. 17.

Next, as shown in FIG. 18, a first heat treatment is applied to the semiconductor substrate SB at a temperature about 300 to 600° C. Then, a second heat treatment is applied at a temperature about 500 to 750° C. to react the material included in the semiconductor layer NR2 or the semiconductor layer PR with the metal included in the metal film MF. In this way, the silicide layer SI3 is formed, which is the reaction product of silicon, which is included in the semiconductor layer NR2 or the semiconductor layer PR, and the metal included in the metal film MF. In other words, the silicide layer SI3 is formed both within the semiconductor layer NR2 and the semiconductor layer PR. Then, the unreacted metal film MF is removed. The silicide layer SI3 is formed of, for example, cobalt silicide ($CoSi_2$), nickel silicide (NiSi), or platinum silicide (PtSi). The heat treatment conditions are adjusted as appropriate according to the material of the metal included in the metal film MF.

The subsequent manufacturing process is nearly the same as the manufacturing process after FIG. 10 of the first embodiment. However, the heart treatment for the formation process of the silicide layer SI1 and the silicide layer SI2, which is performed after the formation of the barrier metal film BMI in the first embodiment, is not performed in the third embodiment because the silicide layer SI3 has already been formed.

As described above, in the third embodiment, the silicide layer SI3 is formed in a different process from the formation process of the metal film of the barrier metal film BM1. For this reason, the number of manufacturing processes of the third embodiment is greater than that of the first embodiment.

However, in the third embodiment, the material of the silicide layer SI3 can be freely set without depending on the material of the metal film of the barrier metal film BM1.

For example, in the first embodiment, the silicide layer SI1 is comprised of titanium silicide. However, in the third embodiment, the material of the silicide layer SI3 can be selected from cobalt silicide, nickel silicide, and platinum silicide, which are materials with a resistance lower than titanium silicide. Thus, it is possible to further reduce the contact resistance between the semiconductor layer PR and the plug PG1 as well as the contact resistance between the semiconductor layer NR2 and the plug PG1.

Further, like the first variation of the first embodiment, the silicide layer SI3 can be formed so as to reach the semiconductor later NR1. In this case, the silicide layer SI3 is formed so that the semiconductor layer NR1 is not germanided.

Further, in the third embodiment, because the silicide layer SI3 has already been formed, the barrier metal film BM1 can be a single layer film of metal nitride film, instead of a laminated film of a metal film such as titanium and a metal nitride film such as titanium nitride. In this case, the manufacturing process can be simplified due to the absence of the formation process of the metal film such as titanium.

However, from the point of view of reliability, also in the third embodiment, it is more desirable that the barrier metal film BM1 is formed as a laminated film of the metal film and the metal nitride film. For example, there is a case in which a thin film such as natural oxide film is formed on the surface of the silicide layer SI3 just before forming the barrier metal film BM1. At this time, when a metal film such as titanium is formed on the surface of the silicide layer SI3, titanium reacts with the natural oxide film and then natural oxide film on the surface of the silicide layer SI3 can be removed. Thus, it is possible to reduce the contact resistance between the plug PG1 and the silicide layer SI3.

Note that the first to third embodiments have described the case in which the material of the cap layer CP and the semiconductor layer SL is silicon. Thus, the compound layers of the semiconductor material within the semiconductor layer NR2 (cap layer CP) and within the semiconductor layer SL, and the metal material of the barrier metal films BM1 to M3 are referred to as the "silicide layers SI1 to SI3". However, in the present invention, the material of the cap layer CP and the semiconductor layer SL is not limited to silicon.

Further, the first to third embodiments have described the case in which the semiconductor layer PR, the semiconductor layer NR1, and the semiconductor layer NR2 are formed by ion implantation. However, in the present invention, the semiconductor layer PR, the semiconductor layer NR1, and the semiconductor NR2 can also be formed by epitaxial growth in the same way as for the semiconductor layer EP. In other words, it is also possible that the semiconductor layer NR1 into which an n-type impurity is introduced is formed over the i-type semiconductor layer EP by epitaxial growth and then the semiconductor layer NR2 (cap layer CP) into which an n-type impurity is introduced is formed over the semiconductor layer NR1 by epitaxial growth. In this case, the first insulating film IF1 in which an opening is formed to define the formation area of the photoreceiver is formed over the substrate before forming the semiconductor layer PR.

While the invention made by the present inventors has been concretely described based on the embodiments, the present invention is not limited to the specific embodiments and various modifications and variations can be made without departing from the scope of the present invention.

Some of other contents described in the embodiments are shown below.

[Note 1]

A semiconductor device includes: a first semiconductor layer formed over a substrate and including an impurity of a first conductive type; a second semiconductor layer formed over the first semiconductor layer; a third semiconductor layer formed over the second semiconductor layer and including an impurity of a second conductive type opposite to the first conductive type; a fourth semiconductor layer formed over the third semiconductor layer, the fourth semiconductor layer being comprised of a material different from that of the third semiconductor layer; a first compound layer formed within the fourth semiconductor layer, the first compound layer being a reaction product of a first metal and the material included in the fourth semiconductor layer; and a first plug formed over the first compound layer, the first plug being electrically coupled to the third semiconductor layer through the first compound layer. The first semiconductor layer, the second semiconductor layer, and the third semiconductor layer, respectively, configure part of a photoreceiver. The reaction product of the first metal and the metal included in the third semiconductor layer is not formed within the third semiconductor layer.

[Note 2]

A manufacturing method of semiconductor device includes the steps of: (a) preparing a substrate; (b) forming a first semiconductor layer including an impurity of a first conductive type over the substrate; (c) forming a first insulating film over the substrate; (d) forming a through part in the first insulating film by selectively removing the first insulating film; (e) forming a second semiconductor layer over the first semiconductor layer exposed within the through part, after the step (d); (f) forming a third semiconductor layer including an impurity of a second conductive type opposite to the first conductive type, over the second semiconductor layer; (g) forming a fourth semiconductor layer of a material different from that of the third semiconductor layer, over the third semiconductor layer; (h) forming a first interlayer insulating film over the first semiconductor layer and over the fourth semiconductor layer; (i) forming a first contact hole in the first interlayer insulating film so as to reach the forth semiconductor layer; (j) forming a first compound layer, which is a reaction product of a first metal and the material included in the fourth semiconductor layer, inside the first contact hole, in such a way that the reaction product of the first metal and the material included in the third semiconductor layer is not formed within the third semiconductor layer; and (k) forming a first plug that is electrically coupled to the third semiconductor layer through the first compound layer, inside the first contact hole. The first semiconductor layer, the second semiconductor layer, and the third semiconductor layer respectively configure part of a photoreceiver.

[Note 3]

In the manufacturing method of semiconductor device described in Note 2, the steps (e), (f), and (g) are respectively performed by epitaxial growth.

[Note 4]

In the manufacturing method of semiconductor device described in Note 2, the step (b) is performed by epitaxial growth.

What is claimed is:

1. A semiconductor device comprising:
    a first semiconductor layer formed over a substrate and including an impurity of a first conductive type;
    a second semiconductor layer formed over the first semiconductor layer;
    a third semiconductor layer formed within the second semiconductor layer, the third semiconductor layer being part of the second semiconductor layer and including an impurity of a second conductive type opposite to the first conductive type;

a fourth semiconductor layer formed over the third semiconductor layer, the fourth semiconductor layer being comprised of a material different from that of the second semiconductor layer;

a first compound layer formed within the fourth semiconductor layer, the first compound layer being a reaction product of a first metal and the material included in the fourth semiconductor layer; and a first plug formed over the first compound layer, the first plug being electrically coupled to the third semiconductor layer through the first compound layer, wherein the first semiconductor layer, the second semiconductor layer, and the third semiconductor layer respectively configure part of a photoreceiver, and wherein a reaction product of the first metal and the material included in the third semiconductor layer is not formed within the third semiconductor layer.

2. The semiconductor device according to claim 1,
wherein the bottom surface of the first compound layer is located within the fourth semiconductor layer in such a way that the bottom surface of the first compound layer does not reach the third semiconductor layer.

3. The semiconductor device according to claim 1,
wherein the first compound layer directly comes into contact with the third semiconductor layer.

4. The semiconductor device according to claim 1,
wherein a second compound layer is formed within the first semiconductor layer, the second compound layer being a reaction product of the first metal or a second metal, which is a different material, and the material included in the first semiconductor layer, wherein a second plug, which is electrically coupled to the first semiconductor layer through the second compound layer, is formed over the second compound layer, and wherein the thickness of the second compound layer is greater than the thickness of the first compound layer.

5. The semiconductor device according to claim 1,
wherein the first plug has a first barrier metal film including the first metal, as well as a first conductive film, and wherein the first compound layer is a reaction product of the first metal included in the first barrier metal film and the material included in the fourth semiconductor layer.

6. The semiconductor layer according to claim 5,
wherein the first metal is titanium,
wherein the fourth semiconductor layer includes silicon, and
wherein the first compound layer is comprised of titanium silicide.

7. The semiconductor device according to claim 1,
wherein the first plug has a first barrier metal film including a third metal, as well as a first conductive film, and wherein the first metal is a material different from that of the third metal.

8. The semiconductor device according to claim 7,
wherein the first metal is cobalt, nickel, or platinum,
wherein the fourth semiconductor layer includes silicon, and
wherein the first compound layer is comprised of cobalt silicide, nickel silicide, or platinum silicide.

9. The semiconductor device according to claim 1,
wherein the first conductive type is p type,
wherein the second conductive type is n type,
wherein the second semiconductor layer is comprised of germanium, which is an intrinsic semiconductor or a p or n type semiconductor having an impurity concentration of less than $1 \times 10^{17}/cm^3$, and wherein the photoreceiver is a pin junction structure.

* * * * *